United States Patent [19]
Lee

[11] Patent Number: 5,824,439
[45] Date of Patent: Oct. 20, 1998

[54] PHASE SHIFITING MASK AND METHOD OF MANUFACTURING THE SAME

[75] Inventor: Jun-Seok Lee, Seoul, Rep. of Korea

[73] Assignee: LG Semicon Co., Ltd., Chungcheongbuk-Do, Rep. of Korea

[21] Appl. No.: 861,939

[22] Filed: May 22, 1997

[30] Foreign Application Priority Data

Sep. 2, 1996 [KR] Rep. of Korea .................. 1996 37790

[51] Int. Cl.[6] ....................................................... G03F 9/00
[52] U.S. Cl. ................................................................. 430/5
[58] Field of Search ............................... 430/5, 314, 322, 430/323, 324

[56] References Cited

U.S. PATENT DOCUMENTS

| | | | |
|---|---|---|---|
| 5,290,647 | 3/1994 | Miyazaki et al. | 430/5 |
| 5,300,378 | 4/1994 | Minami | 430/5 |
| 5,300,379 | 4/1994 | Dao et al. | 430/5 |
| 5,437,947 | 8/1995 | Hur et al. | 430/5 |
| 5,705,300 | 1/1998 | Bae | 430/5 |

*Primary Examiner*—S. Rosasco
*Attorney, Agent, or Firm*—Morgan, Lewis & Bockius LLP

[57] ABSTRACT

A phase shifting mask includes a transparent substrate having a groove; a light-shading layer formed within the groove to shade an incident light; and a phase shifting layer formed on the light-shading layer and a portion of the transparent substrate for shifting a phase of the incident light.

33 Claims, 7 Drawing Sheets

PHASE SHIFTING MASK AND METHOD OF MANUFACTURING THE SAME

This application claims the benefit of Korean Application No. 96-37790, which is hereby incorporated by reference.

BACKGROUND OF THE INVENTION

1. Field of the Invention

The present invention relates to a phase shifting mask and a method of manufacturing the same, and more particularly, to a phase shifting mask and a method of manufacturing the same for use in a photolithography process in a semiconductor device.

2. Discussion of the Related Art

As the integration of a semiconductor device increases and its package density becomes higher, the size of its unit elements decreases. As a result, the width of a metal line becomes narrower. Therefore, in order to form a fine pattern, a photolithography process utilizing exposure methods, such as a contact printing method, a proximity printing method, and a projection printing method, is used but has limitations. Accordingly, in order to form a fine pattern, the exposure process needs to be improved by using an electron beam and an ion beam, or a phase shifting mask.

The phase shifting mask generally includes a phase shifting region and a light-transmission region. The phase of light passing through the phase shifting region is shifted by 180°, thus causing an interference with light passing through the light-transmission region. As a result, the resolution and the depth of focus are improved, making it possible to obtain a good quality pattern.

The phase shifting masks can be classified into an alternated type, a rim type, an attenuated type, and an outrigger type. For example, a conventional rim type phase shifting mask is disclosed by Nitayama et al., "New Phase Shifting Mask Self-aligned Phase Shifters for a Quarter Micron Photolithography", IEDM, pp. 57–60 (1989). Another conventional rim type phase shifting mask is disclosed in U.S. Pat. No. 5,300,378 by Minami et al., "Method of Producing a Phase Shifting Mask."

FIGS. 1A to 1D are cross-sectional views illustrating a conventional method of manufacturing a phase shifting mask in accordance with the method by Nitayama et al.

Figure 1A:
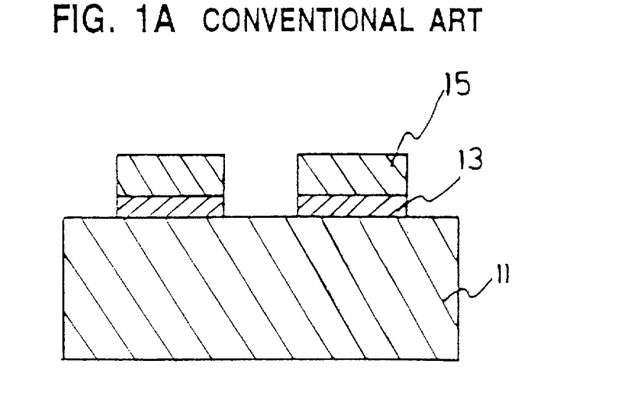
FIGS. 1A to 1D are cross-sectional views illustrating a conventional method of manufacturing a phase shifting mask.

Referring to FIG. 1A, an opaque material, e.g., a chrome, is deposited on a transparent substrate 11 by a sputtering method, thereby forming a light-shading layer 13. Then, after coating a photoresist film 15 on the transparent substrate 11 and the light-shading layer 13, it is exposed and developed to expose a predetermined portion of the light-shading layer 13.

Figure 1B:
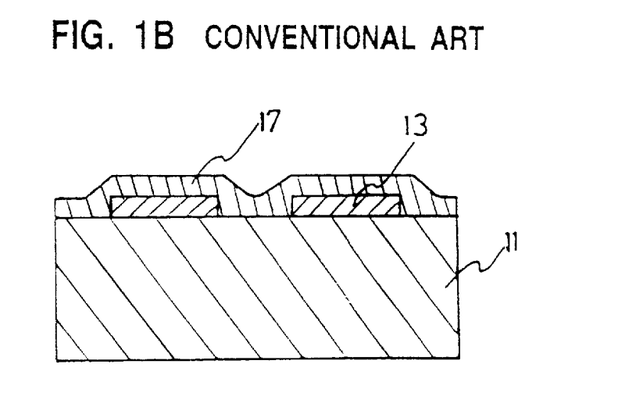

Referring to FIG. 1B, the photoresist film 15 is removed. Then, a transparent photoresist material, e.g., a poly-methyl-methacrylate (PMMA), is spin-coated on the transparent substrate 11 and the light-shading layer 13, thereby forming a phase shifting layer 17. Here, the phase shifting layer 17 is formed to a thickness of $\lambda/\{2(n-1)\}$, where $\lambda$ is the wavelength of the phase shifted light and n is the refractive index of the phase shifting layer 17.

Figure 1C:
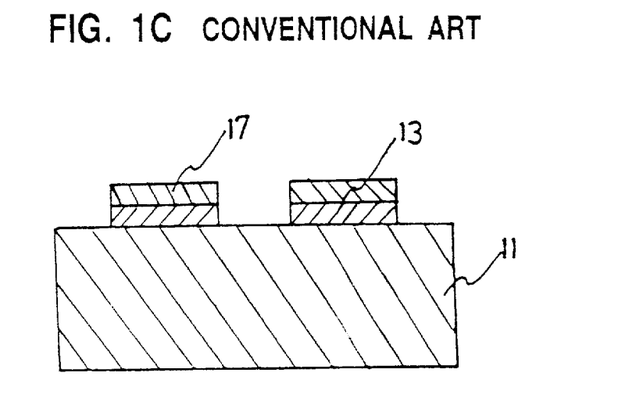

Referring to FIG. 1C, using the light-shading layer 13 as a mask, the phase shifting layer is exposed through the back side and developed. Since the phase shifting layer 17 has a photosensitive characteristic, only the region which is in contact with the transparent substrate 11 is exposed and developed. As a result, the phase shifting layer 17 remains only on the light-shading layer 13.

Figure 1D:
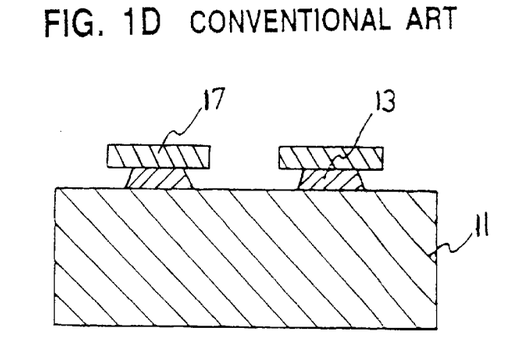

Referring to FIG. 1D, the light-shading layer 13 is etched using an etchant so that the light-shading layer 13 is etched in a sideward direction. As a result, the lower part of the phase shifting layer 17 is undercut. Here, the undercut part of the phase shifting layer becomes a phase shifting region and the part which is in contact with the light-shading layer 13 becomes a light-shading region. A part where the phase shifting layer 17 is not formed is a light-transmission region.

FIGS. 2A to 2D are cross sectional views illustrating a conventional method of manufacturing a phase shifting mask in accordance with the method by Minami et al.

Figure 2A:
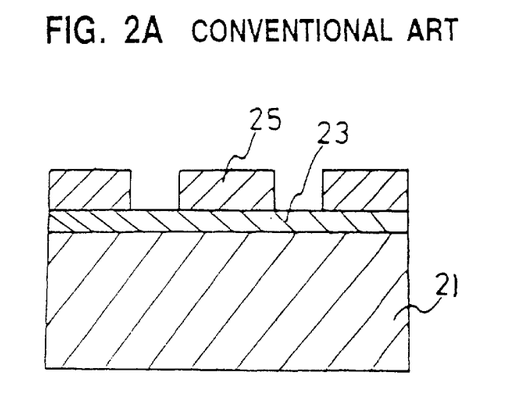
FIGS. 2A to 2D are cross-sectional views illustrating another conventional method of manufacturing a phase shifting mask.

Referring to FIG. 2A, an opaque material, e.g., zinc (Zn) or polycrystalline silicon, is deposited on a transparent substrate 21 to form a light-shading layer 23. Then, after coating a photoresist film 25 on the light-shading layer 23, it is exposed and developed to expose a predetermined portion of the light-shading layer 23.

Figure 2B:
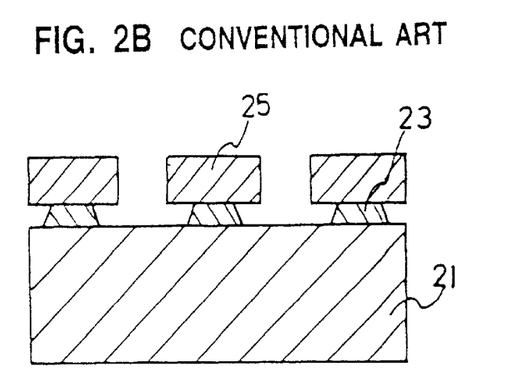

Referring to FIG. 2B, using the photoresist film 25 as a mask, the light-shading layer 23 is overetched. Here, the light-shading layer 23 is sidewardly etched below the photoresist film 25 and thus undercutting the photoresist film 25. The part where the light-shading layer 23 remains is a light-shading region.

Figure 2C:
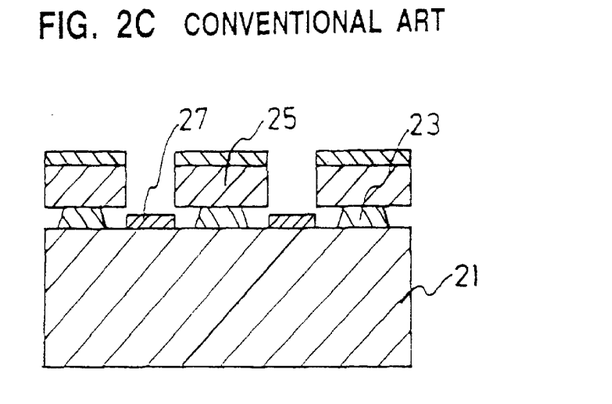

Referring to FIG. 2C, using the photoresist film 25 as a mask, a transparent material, e.g., ZnO, is deposited on the transparent substrate 21 by a sputtering method, thereby forming a phase shifting layer 27. The phase shifting layer 27 is formed to a thickness of $\lambda/\{2(n-1)\}$, and spaced apart from the light-shading layer 23 by a predetermined distance. Here, $\lambda$ is the wavelength of the phase shifted light and n is the refractive index of the phase shifting layer 27. When forming the phase shifting layer 27, the material for forming the phase shifting layer 27 is also deposited on the photoresist film 25. A part where the phase shifting layer 27 is formed is a phase shifting region.

Figure 2D:
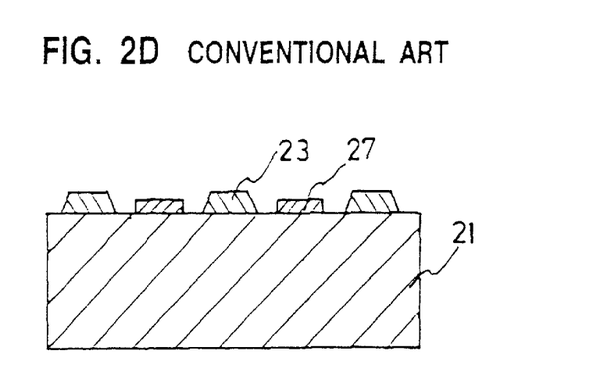

Referring to FIG. 2D, through a lift-off method, the photoresist film 25 and the material for forming the phase shifting layer 27 deposited on the photoresist film 25 are removed. An exposed portion of the transparent substrate 21 between the light-shading layer 23 and the phase shifting layer 27 is a light-transmission region.

In the aforementioned conventional methods, the phase shifting layer or the photoresist film is formed on the light-shading layer. The light-shading layer is wet etched to limit its width. As a result, the phase shifting region is defined by the limited width of the light-shading layer according to the method by Nitayama et al., and the phase shifting layer is formed between the light-shading layers according to the method by Minami et al.

However, the conventional methods of manufacturing a phase shifting mask has the following problems. First, since the phase shifting layer is formed by a sputtering method or a spin-coating method, unevenness and non-uniformity of the surface result. In addition, since the light-shading layer is etched sidewardly, the phase shifting effect is deteriorated due to slanted sides of the light-shading layer. Furthermore, since the light-shading layer is etched sidewardly, the contact area between the phase shifting layer and the light shading layer becomes smaller. Therefore, the adhesion therebetween is not very strong, making it possible for the two layers to be mechanically or physically separated from each other.

SUMMARY OF THE INVENTION

Accordingly, the present invention is directed to a phase shifting mask and a method of manufacturing the same that substantially obviates one or more of the problems due to limitations and disadvantages of the related art.

An object of the present invention is to provide a phase shifting mask with an improved adhesion between a light-shading layer and a phase shifting layer to prevent a physical or a mechanical separation of the two layers.

Another object of the present invention is to provide a method of manufacturing a phase shifting mask in which a light-shading layer is formed to a uniform thickness and the surface planarity of a phase shifting layer is raised, thereby improving the phase shifting effect.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a phase shifting mask of the present invention includes a transparent substrate, a groove formed to a predetermined depth on the transparent substrate, a light-shading layer formed within the groove to shade an incident light, and a phase shifting layer formed such that a predetermined part is in contact with the light-shading layer and the other part is in contact with the transparent substrate, thereby shifting the phase of the incident light.

In another aspect, a method of manufacturing a phase shifting mask of the present invention includes the steps of forming a sacrificial layer on a predetermined region of a transparent substrate and forming sidewalls on the sides of the sacrificial layer; anisotropically etching the transparent substrate by using the sacrificial layer and the sidewalls as a mask, to thereby form a groove; removing the sidewalls; depositing an opaque material which becomes transparent when being oxidized so as to fill the groove on the exposed region of the transparent substrate and oxidizing the opaque material to form a phase shifting layer and simultaneously, to define a light-shading layer within the groove; and removing the sacrificial layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 3:
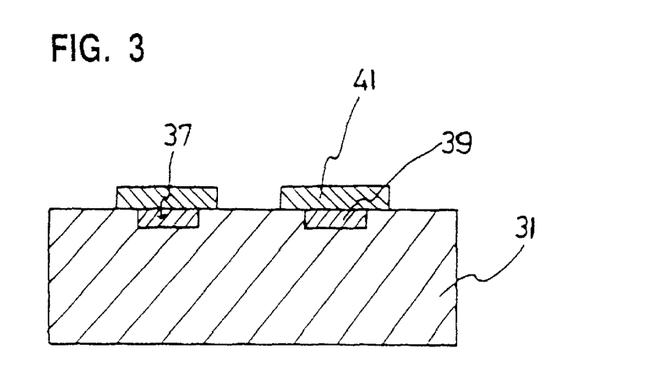
FIG. 3 is a cross-sectional view of a phase shifting mask in accordance with the present invention.

FIG. 3 is a cross-sectional view of a phase shifting mask in accordance with the present invention. As shown in FIG. 3, a groove 37 with a depth of about 500~4000 Å is formed on a predetermined region of a transparent substrate 31 made of a transparent material, e.g., soda lime glass or quartz. A light-shading layer 39 is formed within the groove 37. A phase shifting layer 41 is formed on the light-shading (or shielding) layer 39 to overlap with the transparent substrate 31. Here, the light-shading layer 39 is used to shade an incident light and is formed only within the groove 37. The phase shifting layer 41 is used to shift the phase of the incident light wavelength by 180° and is formed to be in contact with the transparent substrate 31 at both sides of the groove 37. Here, with a thickness of about 500~4000 Å, the light-shading layer 39 is formed of zinc (Zn), polycrystalline silicon, or an inorganic resist of Ge—Se group, whose light-transmissivity is lower than 30%, and preferably in the range of about 0~5%. The phase shifting layer 41 is formed of ZnO or $SiO_2$, which has a high light-transmissivity. The phase shifting layer 41 is formed to a thickness of $\lambda/\{2(n-1)\}$ in order to shift the phase of the incident light wavelength by 180°, where $\lambda$ is the wavelength of incident light and n is the refractive index of the phase shifting layer 41. Here, the refractive indices of Zn and $SiO_2$ constituting the phase shifting layer 41 are about 1.4~1.5 and 1.42~1.44, respectively. Accordingly, in order to shift the phase of an i-line light whose wavelength is 365 nm, the phase shifting layer 41 should be formed to a thickness of about 3500~5000 Å.

The light-shading layer 39 and the phase shifting layer 41 may constitute one body, or constitute different or separate bodies. In the former case, the light-shading layer 39 is preferably formed of Zn or polycrystalline silicon, and the phase shifting layer 41 is preferably formed of ZnO or $SiO_2$ which are obtained by oxidizing Zn or polycrystalline silicon of the light-shading layer 39. In other words, the groove 37 is etched anisotropically to have a uniform thickness. Zn or polycrystalline silicon is then deposited in the groove 37 to a predetermined thickness on the transparent substrate 31, and oxidized from the top surface to the region which is in contact with the transparent substrate 31. At this time, the unoxidized region becomes the light-shading layer 39 and the oxidized region becomes the phase shifting layer 41. In the latter case, the light-shading layer 39 is preferably formed of an inorganic resist of Ge—Se group and the phase shifting layer 41 is preferably formed of a liquid phase grown $SiO_2$. Here, the light-shading layer 39 is formed to a uniform thickness within the groove 37 having a uniform depth, thereby improving the phase shifting effect.

Regardless of whether the light-shading layer 39 and the phase shifting layer 41 constitute one body or different bodies, the phase shifting layer 41 is in contact with a predetermined part of the transparent substrate 31 as well as the light-shading layer 39, thereby increasing the adhesion.

In addition, in order to prevent the accumulation of charges during exposure by an electron beam and to prevent the transparent substrate from being damaged during the manufacturing process, the phase shifting mask of the present invention may further comprises an etch stop layer of a transparent conductive material, e.g., an indium tin oxide (ITO), formed to a thickness of about 500~4000 Å on the transparent substrate 31.

FIGS. 4A to 4D are cross-sectional views illustrating a method of manufacturing a phase shifting mask in accordance with a first embodiment of the present invention.

Figure 4A:
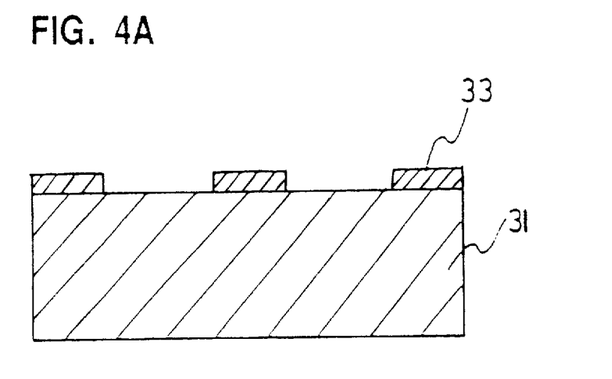
FIGS. 4A to 4D are cross-sectional views illustrating a method of manufacturing a phase shifting mask in accordance with a first embodiment of the present invention.

Referring to FIG. 4A, on a transparent substrate 31 made of a transparent material such as soda lime glass or quartz, a silicon oxide or a silicon nitride is deposited to a thickness of about 3500~5000 Å by a chemical vapor deposition (hereinafter, referred to as CVD) method, thereby forming a sacrificial layer 33. Then, through a photolithography method including an electron beam exposure, the sacrificial layer 33 is patterned to expose a predetermined portion of the transparent substrate 31.

Figure 4B:
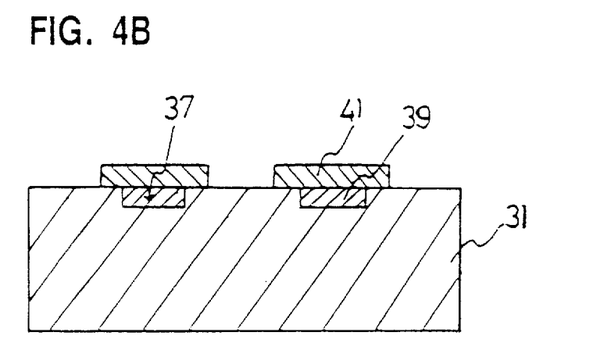

Referring to FIG. 4B, sidewalls 35 are formed to a thickness of about 1000~4000 Å on the sides of the sacrificial layer 33. For example, a polymer layer is coated on the sacrificial layer 33 and the exposed region of the transparent substrate 31. Then, the polymer layer is etched back by a reactive ion etching (hereinafter, referred to as RIE) method, thereby forming sidewalls 35. Then, using the sacrificial layer 33 and sidewalls 35 as a mask, the exposed region of the transparent substrate 31 is anisotropically etched by the RIE method, for example, thereby forming a groove 37 to a depth of about 500~4000 Å.

Figure 4C:
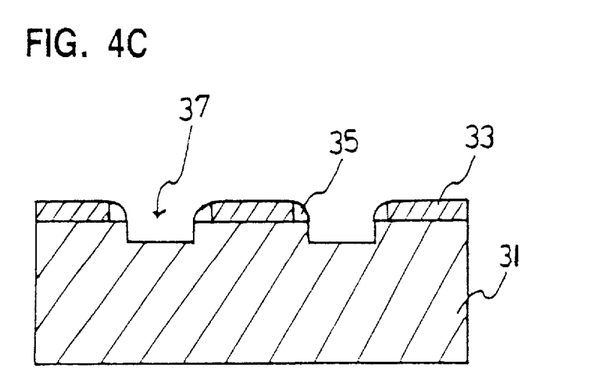

Referring to FIG. 4C, sidewalls 35 are removed. Then, on the sacrificial layer 33 and the exposed region of the transparent substrate 31, Zn or polycrystalline silicon with a light-transmissivity lower than 30% and preferably about 0~5% is deposited to fill the groove 37 by a CVD method. Then, through a chemical mechanical polishing (hereinafter, referred to as CMP) method, zinc or polycrystalline silicon on the sacrificial layer 33 and the transparent substrate 31 is polished to expose the sacrificial layer 33 and planarized. Then, oxygen ions are implanted into the zinc or polycrystalline silicon and heat-treated, or heat is applied to oxidize the zinc or polycrystalline silicon, thereby forming a phase shifting layer 41.

Here, the part where the zinc or polycrystalline silicon is not oxidized is defined as a light-shading layer 39. The phase shifting layer 41 is formed so as to be in contact with the transparent substrate 31 at both sides of the groove 37, thereby limiting the light-shading layer 39 to be within the groove 37. Accordingly, the light-shading layer 39 is formed to a thickness of about 500~4000 Å, and the phase-shifting layer 41 is formed to a thickness of about 3500~5000 Å.

Figure 4D:
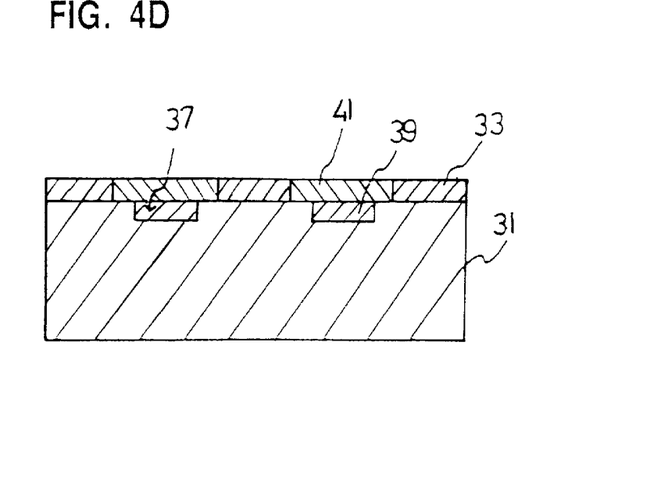

Referring to FIG. 4D, the sacrificial layer 33 is selectively removed using an etchant, e.g., $H_3PO_4$, which has a high etch selectivity to the phase shifting layer 41, thereby exposing the transparent substrate 31. The exposed portion of the transparent substrate 31 becomes a light-transmission region.

According to the first embodiment of the present invention as described above, the groove is formed in the transparent substrate, and the zinc or polycrystalline silicon is deposited and polished by the CMP method. Then, the zinc or polycrystalline silicon outside of the groove is oxidized to form the phase shifting layer and the light-shading layer at the same time. Therefore, the light-shading layer has a uniform thickness to thereby improve the phase shifting layer. The phase shifting layer and the light-shading layer constitute one body to increase the adhesion. Furthermore, the surface planarity of the phase shifting layer is improved by the CMP method.

FIGS. 5A to 5D are cross-sectional views illustrating a method of manufacturing a phase shifting mask in accordance with to a second embodiment of the present invention.

Figure 5A:
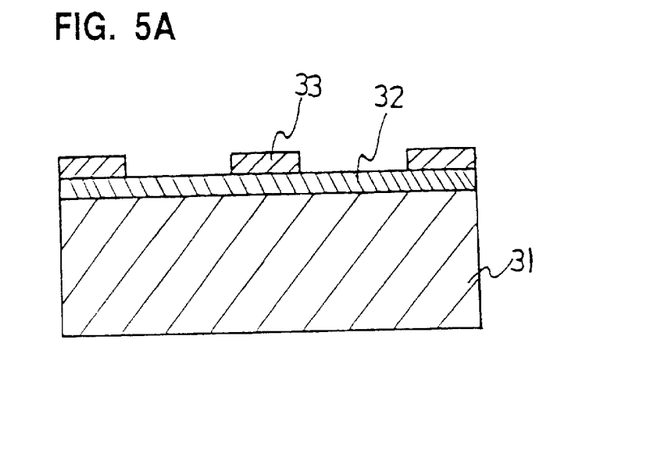
FIGS. 5A to 5D are cross-sectional views illustrating a method of manufacturing a phase shifting mask in accordance with a second embodiment of the present invention.

Referring to FIG. 5A, on a transparent substrate 31 made of a transparent material, e.g., soda lime glass or quartz, a transparent conductive material, e.g., ITO, is deposited to a thickness of about 500~4000 Å by a CVD method, thereby forming an etch stop layer 32. Then, a silicon oxide or a silicon nitride is deposited to a thickness of about 3500~5000 Å on the etch stop layer 32 by the CVD method, thereby forming the sacrificial layer 33. Through a photolithography method including a beam exposure, the sacrificial layer 33 is patterned to expose a predetermined portion of the etch stop layer 32. Here, the etch stop layer 32 prevents the transparent substrate 31 from being damaged when the sacrificial layer 33 is patterned.

Figure 5B:
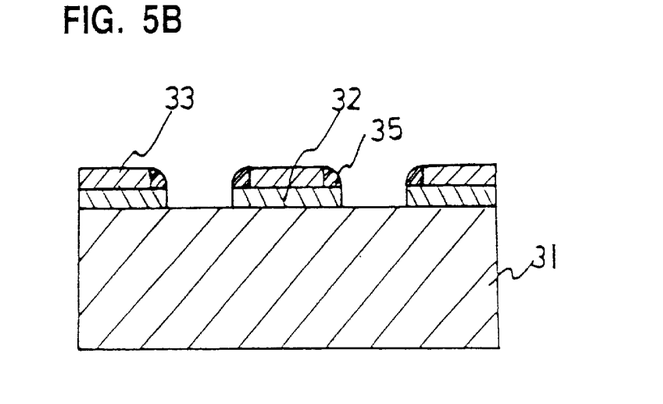

Referring to FIG. 5B, sidewalls 35 are formed to a thickness of about 1000~4000 Å on the sides of the sacrificial layer 33. For example, a polymer layer is coated on the sacrificial layer 33 and the exposed portion of the etch stop layer 32. The polymer layer is then etched back by a RIE method to form the sidewalls 35. Then, using the sacrificial layer 33 and the sidewalls 35 as a mask, the exposed portion of the etch stop layer 32 is anisotropically etched to expose the transparent substrate 31 by the RIE method. At this time, the transparent substrate 31 may also be etched to a predetermined depth.

Figure 5C:
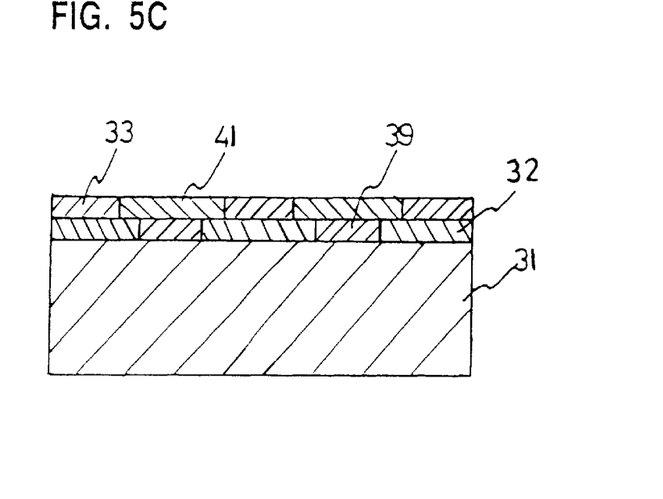

Referring to FIG. 5C, the sidewalls 35 are removed. Then, on the sacrificial layer 33 and the exposed portion of the etch stop layer 32, zinc or polycrystalline silicon with a light-transmissivity lower than 30% and preferably in a range of about 0~5% is deposited by the CVD method. Then, through a CMP method, zinc or polycrystalline silicon deposited on the sacrificial layer 33 and the etch stop layer 32 is polished to expose the sacrificial layer 33 and planarized. Then, oxygen ions are implanted into the zinc or polycrystalline silicon and heat-treated. Alternately, heat is applied to oxidize the zinc or polycrystalline silicon. As a result, a phase shifting layer 41 is formed. Here, the part where the zinc or polycrystalline silicon is not oxidized is defined as a light-shading layer 39. The light-shading layer 39 is formed to a thickness of about 500~4000 Å, and the phase-shifting layer 41 is formed to a thickness of about 3500~5000 Å.

Figure 5D:
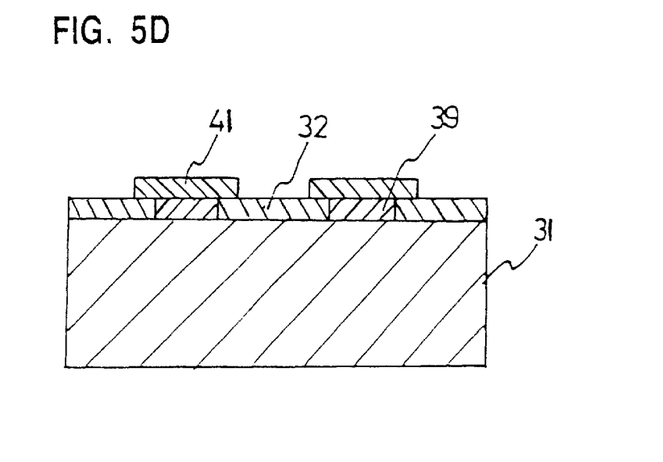

Referring to FIG. 5D, the sacrificial layer 33 is selectively removed using an etchant, e.g., $H_3PO_4$, which has a high etch selectivity to the phase shifting layer 41, thereby exposing the etch stop layer 32. The exposed part of the etch stop layer 32 becomes a light-transmission region.

According to the second embodiment of the present invention as described above, a groove is formed in the etch stop layer. The groove may extend into the transparent substrate as an alternative embodiment. The light-shading layer within the groove and the phase shifting layer outside of the groove are formed as one body. The surface of the phase shifting layer is polished by the CMP method. Thus, adhesion between the phase shifting layer and the light-shading layer is excellent and the planarity of the surface is improved. Further, the etch stop layer is deposited on the transparent substrate and prevents the transparent substrate from being damaged when the sacrificial layer is etched.

FIGS. 6A to 6D are cross-sectional views illustrating a method of manufacturing a phase shifting mask in accordance with a third embodiment of the present invention.

Figure 6A:
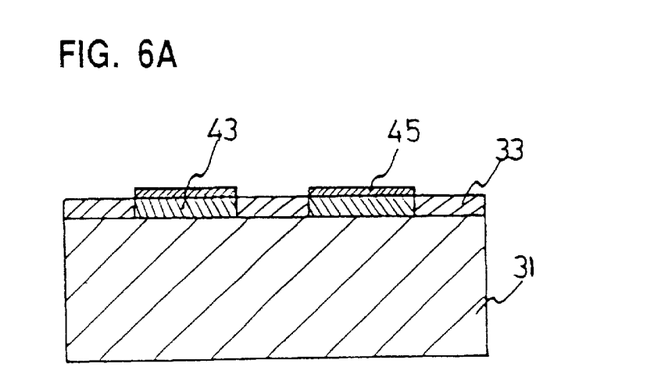
FIGS. 6A to 6D are cross-sectional views illustrating a method of manufacturing a phase shifting mask in accordance with a third embodiment of the present invention.

Referring to FIG. 6A, on a transparent substrate 31 made of a transparent material, e.g., soda lime glass or quartz, an inorganic resist including Ge—Se group is spin-coated to a thickness of about 3500~5000 Å, thereby forming a resist layer 43. Then, a degeneration layer 45 containing silver (Ag) is deposited to a thickness of about 100~200 Å on the resist layer 43. Then, an electron beam (E-beam) is irradiated on a predetermined portion of the degeneration layer 45 to thereby form a sacrificial layer 33. In other words, the silver of the degeneration layer 45 is diffused into the resist layer 43, so that the E-beam irradiated part becomes the sacrificial layer 33 of Ag—Ge—Se group having an etch-resistance.

Figure 6B:
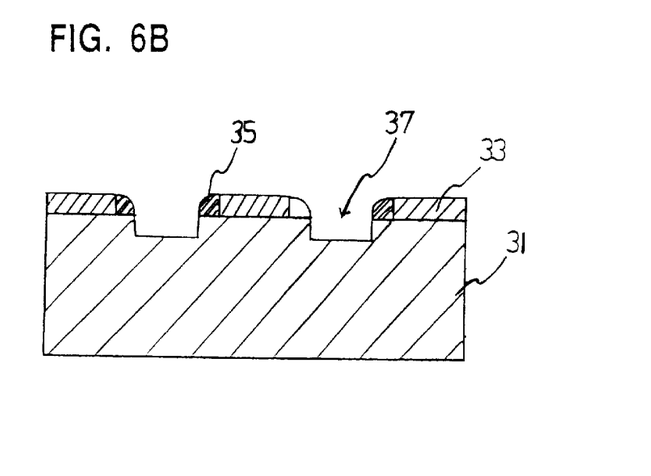

Referring to FIG. 6B, the resist layer 43 and the remaining degeneration layer 45, excluding the sacrificial layer 33, are removed to expose the transparent substrate 31. Then, sidewalls 35 are formed to a thickness of about 1000~4000 Å on the sides of the sacrificial layer 33. For example, a polymer layer is coated on the sacrificial layer 33 and the exposed portion of the transparent substrate 31. The polymer layer is then etched back by a RIE method to form the sidewalls 35. Then, using the sacrificial layer 33 and the sidewalls 35 as a mask, the exposed portion of the transparent substrate 31 is anisotropically etched to form a groove 37 with a thickness of about 500~4000 Å.

Figure 6C:
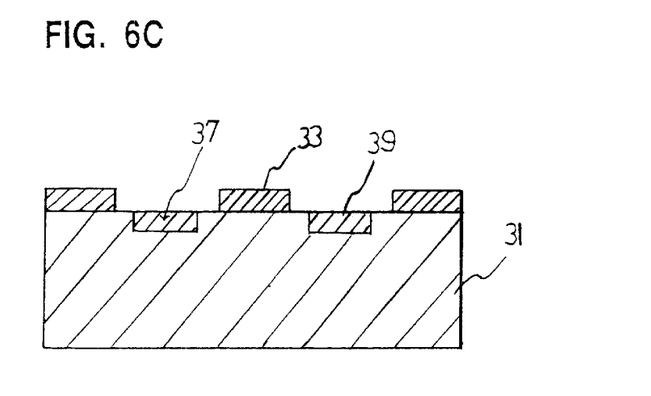

Referring to FIG. 6C, the sidewalls 35 are removed. Then, on the sacrificial layer 33 and the exposed portion of the transparent substrate 31, an inorganic resist including Ge—Se group is spin-coated to a thickness of about 3500~5000 Å to fill the groove 37. Then, the inorganic resist on the sacrificial layer 33 and the transparent substrate 31 is planarized to expose the sacrificial layer 33 by a CMP method. Next, the inorganic resist is etched back by a RIE method until the transparent substrate 31 is exposed, thereby forming a light-shading layer 39. Here, the light-shading layer 39 is limited within the groove 37 and is formed to a thickness of about 500~4000 Å.

Figure 6D:
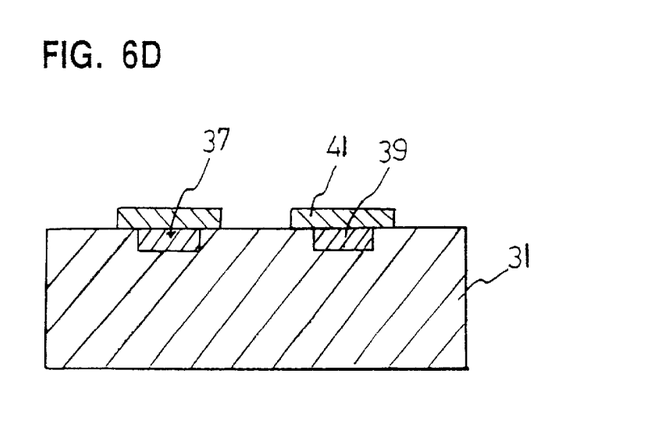

Referring to FIG. 6D, using the sacrificial layer 33 as a mask, a silicon oxide is liquid phase grown to a thickness of about 3500~5000 Å on the light-shading layer 39 and the exposed part of the transparent substrate 31, thereby forming a phase shifting layer 41. The liquid phase growth is performed by dipping the wafer into over-saturated $SiO_2$ solution with a temperature of about 30° C. Then, the sacrificial layer 33 is selectively removed using $H_2SO_4$, for example, thereby exposing the transparent substrate 31. Here, the exposed portion of the transparent substrate 31 becomes a light-transmission region.

According to the third embodiment of the present invention as described above, silver is diffused into the inorganic resist of Ge—Se group formed on the transparent substrate, thereby forming the sacrificial layer. After forming a groove by removing the remaining inorganic resist of Ge—Se group and etching the transparent substrate, the groove is filled with inorganic resist to form the light-shading layer. The phase shifting layer is formed by the liquid phase growth at a low temperature, thereby improving the surface planarity thereof. Further, even if the phase shifting layer is formed of a different body from that of the light-shading layer, it is in contact with both the transparent substrate and the light-shading layer. This results in increased adhesion.

Accordingly, the present invention has at least the following advantages. The light-shading layer is formed to a uniform thickness within the groove, thereby improving the phase shifting effect. In addition, the adhesion between the light-shading layer and the phase shifting layer is increased to prevent the two layers from being mechanically or physically separated from each other. Furthermore, since the phase shifting layer is formed by the liquid phase growth method at a low temperature in the third embodiment, a low temperature process is possible. Also, the surface planarity of the phase shifting layer is greatly improved.

It will be apparent to those skilled in the art that various modifications and variations can be made in the structure of a phase shifting mask and a method of manufacturing the same of the present invention without departing from the spirit or scope of the invention. Thus, it is intended that the present invention cover the modifications and variations of this invention provided they come within the scope of the appended claims and their equivalents.

What is claimed is:

1. A phase shifting mask comprising:
   a transparent substrate having a groove;
   a light-shading layer in the groove for shading an incident light; and
   a phase shifting layer on the light-shading layer and a portion of the transparent substrate for shifting a phase of the incident light,
   wherein a surface portion of the substrate includes an etch stop layer surrounding the light-shading layer.

2. The phase shifting mask as claimed in claim 1, wherein the groove has a depth of approximately 500~4000 Å.

3. The phase shifting mask as claimed in claim 1, wherein the light-shading layer and the phase shifting layer are formed as one body, wherein the light-shading layer includes at least one of zinc or polycrystalline silicon, and wherein the phase shifting layer includes at least one of a zinc oxide or a silicon oxide.

4. The phase shifting mask as claimed in claim 3, wherein the light-shading layer comprises one of zinc (Zn) and polycrystalline silicon.

5. The phase shifting mask as claimed in claim 3, wherein the phase shifting layer comprise one of ZnO and $SiO_2$.

6. The phase shifting mask as claimed in claim 1, wherein the light-shading layer and the phase shifting layer are formed as different bodies, wherein the light-shading layer includes an inorganic resist of a Ge—Se group, and wherein the phase shifting layer includes a silicon oxide.

7. The phase shifting mask as claimed in claim 6, wherein the light-shading layer comprises an inorganic resist of Ge—Se group.

8. The phase shifting mask as claimed in claim 6, wherein the phase shifting layer comprises $SiO_2$.

9. The phase shifting mask as claimed in claim 1, wherein the light-shading layer is only within the groove.

10. The phase shifting mask as claimed in claim 1, wherein the phase shifting layer has a thickness of about 3500~5000 Å.

11. The phase shifting mask as claimed in claim 1, wherein the etch stop layer comprises indium tin oxide.

12. The phase shifting mask as claimed in claim 11, wherein the etch stop layer has a thickness of about 500~4000 Å.

13. A method of manufacturing a phase shifting mask, the method comprising the steps of:
   forming a sacrificial layer having sides on a predetermined region of a transparent substrate;
   forming sidewalls on the sides of the sacrificial layer;
   forming a groove in the transparent substrate using the sacrificial layer and the sidewalls as a mask;
   removing the sidewalls;
   depositing an opaque material, which becomes transparent when being oxidized, to fill the groove and on an exposed region of the transparent substrate;

oxidizing the opaque material to form a phase shifting layer and to define a light-shading layer within the groove; and removing the sacrificial layer.

14. The method of manufacturing a phase shifting mask as claimed in claim 13, wherein the sidewalls are formed of a polymer with a thickness of about 1000~4000 Å.

15. The method of manufacturing a phase shifting mask as claimed in claim 13, wherein the groove is formed to a thickness of about 500~4000 Å.

16. The method of manufacturing a phase shifting mask as claimed in claim 13, wherein the light-shading layer is formed with one of zinc and polycrystalline silicon.

17. The method of manufacturing a phase shifting mask as claimed in claim 16, wherein the step of forming the phase shifting layer and defining the light-shading layer comprises the steps of:

depositing one of zinc and polycrystalline silicon material to fill the groove and on the sacrificial layer and the exposed region of the transparent substrate by a CVD method;

polishing the material on the sacrificial layer and the transparent substrate by a chemical mechanical polishing method, to thereby planarize and expose the sacrificial layer; and oxidizing a portion of the material in contact with the transparent substrate and outside of the groove to form the phase shifting layer, thereby limiting the light-shading layer to within the groove.

18. The method of manufacturing a phase shifting mask as claimed in claim 17, wherein the phase shifting layer is formed by implanting oxygen ions into the portion of the material and performing a heat-treatment.

19. The method of manufacturing a phase shifting mask as claimed in claim 18, wherein the phase shifting layer is formed to a thickness of about 3500~5000 Å.

20. The method of manufacturing a phase shifting mask as claimed in claim 13, further comprising the step of:

forming an etch stop layer on the transparent substrate before the sacrificial layer is formed; and patterning the etch stop layer corresponding to the sacrificial layer and the sidewalls after the step of forming the sidewalls.

21. The method of manufacturing a phase shifting mask as claimed in claim 20, wherein the etch stop layer is formed of indium tin oxide.

22. The method of manufacturing a phase shifting mask as claimed in claim 21, wherein the etch stop layer is formed to a thickness of about 500~4000 Å by a CVD method.

23. The method of manufacturing a phase shifting mask as claimed in claim 13, wherein the step of forming the groove uses anisotropic etching.

24. A method of manufacturing a phase shifting mask, comprising the steps of:

forming a sacrificial layer having sides on a predetermined region of a transparent substrate;

forming sidewalls on the sides of the sacrificial layer;

forming a groove in the transparent substrate using the sacrificial layer and the sidewalls as a mask;

removing the sidewalls;

forming a light-shading layer within the groove;

forming a phase shifting layer on the light-shading layer and an exposed region of the transparent substrate by a liquid phase growth method using the sacrificial layer as a mask; and removing the sacrificial layer.

25. The method of manufacturing a phase shifting mask as claimed in claim 24, wherein the step of forming the sacrificial layer comprises the steps of:

sequentially depositing a resist layer and a degeneration layer including silver on the transparent substrate;

exposing a predetermined part of the degeneration layer to diffuse the silver into the resist layer, thereby forming the sacrificial layer having an etch-resistance; and removing the resist layer and the remaining degeneration layer.

26. The method of manufacturing a phase shifting mask as claimed in claim 25, wherein the resist layer is formed by spin-coating an inorganic resist including Ge—Se group.

27. The method of manufacturing a phase shifting mask as claimed in claim 25, wherein the resist layer is formed to a thickness of about 3500~5000 Å.

28. The method of manufacturing a phase shifting mask as claimed in claim 25, wherein the degeneration layer is formed to a thickness of about 100~200 Å.

29. The method of manufacturing a phase shifting mask as claimed in claim 24, wherein the light-shading layer is formed of an inorganic resist including Ge—Se group.

30. The method of manufacturing a phase shifting mask as claimed in claim 24, wherein the phase shifting layer is formed of $SiO_2$.

31. The method of manufacturing a phase shifting mask as claimed in claim 24, wherein the step of forming the groove uses anisotropic etching.

32. A method of manufacturing a phase shifting mask, the method comprises the steps of:

forming a transparent buffer layer on a transparent substrate;

forming a sacrificial layer having sides on a predetermined region of the transparent buffer layer;

forming sidewalls on the sides of the sacrificial layer;

forming a groove in the transparent buffer layer using the sacrificial layer and the sidewalls as a mask;

removing the sidewalls;

forming a light-shading layer in the groove;

forming a phase shifting layer on the light-shading layer and a portion of the transparent buffer layer; and removing the sacrificial layer.

33. A method of manufacturing a phase shifting mask, the method comprising the steps of:

forming a transparent substrate having a groove;

forming a light-shading layer in the groove for shading an incident light; and forming a phase shifting layer on the light-shading layer and a portion of the transparent substrate for shifting a phase of the incident light, wherein a surface portion of the substrate includes an etch stop layer surrounding the light-shading layer.

* * * * *